United States Patent

Burke et al.

[15] 3,698,621

[45] Oct. 17, 1972

[54] BONDING APPARATUS

[72] Inventors: Jack J. Burke, Richardson; Joseph M. Guillot, Jr., Plano, both of Tex.

[73] Assignee: Collins Radio Company, Dallas, Tex.

[22] Filed: Oct. 27, 1970

[21] Appl. No.: 84,288

[52] U.S. Cl. ........................228/4, 29/471.1, 29/626, 228/44

[51] Int. Cl. ............................B23k 1/00, B23k 37/04

[58] Field of Search ......29/470.1, 471.1, 626; 228/4, 228/5, 44

[56] References Cited

UNITED STATES PATENTS 3,125,906 3/1964 Johnson.........................228/4

3,442,432 5/1969 Santangini...................228/44

3,452,917 7/1969 Schneider....................228/49

*Primary Examiner*—John F. Campbell

*Assistant Examiner*—R. J. Craig

*Attorney*—Henry K. Woodward and Robert J. Crawford

[57] ABSTRACT

Apparatus for automatically thermo-compression bonding of leads to microelectronic circuits thereby obviating wire bonding. Horizontally movable table means is provided beneath vertically movable bonding means with indexing means provided to automatically and sequentially move a plurality of circuits and lead frames on the table into position for bonding.

6 Claims, 10 Drawing Figures

INVENTORS.
JACK J. BURKE
JOSEPH M. GUILLOTT, JR.

BY H. K. Woodward
ATTORNEY

INVENTORS.
JACK J. BURKE
JOSEPH M. GUILLOTT, JR.
BY H. K. Woodward
ATTORNEY

INVENTORS.
JACK J. BURKE
JOSEPH M. GUILLOTT JR.
BY H. K. Woodward
ATTORNEY

INVENTORS.
JACK J. BURKE
JOSEPH M. GUILLOTT, JR.
BY H. K. Woodward
ATTORNEY

BONDING APPARATUS

This invention relates generally to bonding apparatus, and more particularly to bonding apparatus for attaching leads to microelectronic circuits and the like.

Conventionally, the packaging of microelectronic circuits has entailed a wire bonding procedure for interconnecting contacts on the circuit substrate to electrical leads which form an integral part of a circuit container. This necessity for wire bonding imposes severe cost and reliability penalties on packaged circuits.

A recent departure in microelectronic circuit packaging involves attaching leads directly to the circuit substrate and then encapsulating the circuit, utilizing the circuit substrate as a part of the finished package. Copending application, Ser. No. 777,050, filed Nov. 19, 1968, assigned to the present assignee, discloses such an integral package.

The leads may be attached to the ceramic substrate by solder means, or more preferably by thermo-compression bonding means. However, while the latter approach may be preferable because of heat and time considerations, the ceramic substrate is easily fractured.

An object of the present invention is thermo-compression bonding apparatus for microelectronic circuits and the like.

Another object of the invention is bonding apparatus which operates automatically in attaching leads to a plurality of microelectronic circuits.

Still another object of the invention is thermo-compression bonding apparatus which does not fracture the ceramic substrate of microelectronic circuits.

Briefly, a bonding apparatus in accordance with the present invention includes a pressure driven and heated bonding head, a movable table for supporting microelectronic circuits in position beneath the bonding head, and means for indexing said table as each circuit bonding operation is completed. The table preferably accommodates a removable circuit carrier means which supports the circuits and a lead frame and maintains proper positioning thereof during the indexing and bonding sequence.

To prevent fracture of the ceramic circuit substrates, bonding pressure means preferably applies a minimum pressure to the bonding head until the head is moved into firm engagement with the substrate, then maximum bonding pressure is applied.

Control means is provided to synchronize the indexing and bonding operations, and to retract the table to its initial position once all indexing and bonding steps are completed. The lead bonded circuits are removed and a new batch is loaded for processing.

The invention and objects and features thereof will be more readily apparent from the following detailed description and appended claims when taken with the drawings, in which:

Figure 1:
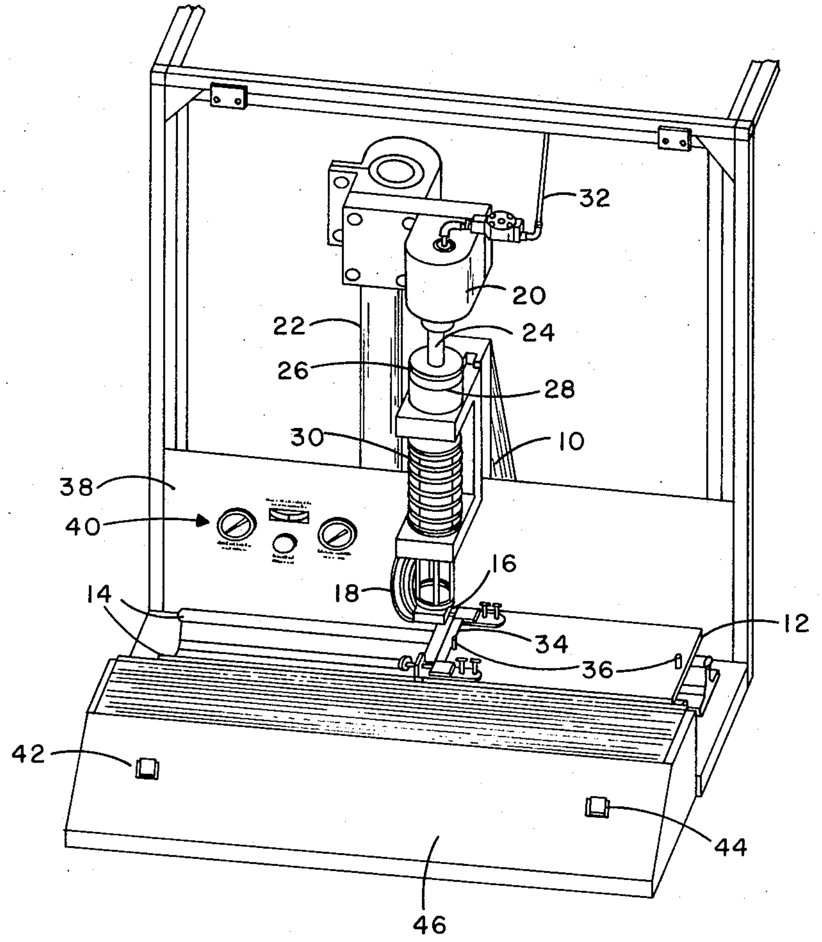
FIG. 1 is a perspective view of bonding apparatus in accordance with the present invention.

Referring now to the drawings, FIG. 1 is a perspective view of an illustrative embodiment of bonding apparatus in accordance with the present invention. The bonding portion shown generally at 10 is vertically mounted above table 12 which is horizontally movable along rails 14. The bonding portion includes a heated bonding head 16. Electric power is supplied to head 16 through means of cables 18. Head 16 is driven by pneumatic cylinder means 20 which is mounted to offset column 22. Piston 24 of cylinder 20 includes a flange 26 which limits the travel of piston 24 by engagement with stationary member 28. Spring 30 yieldably maintains head 16 in a raised position until bonding pressure is applied to cylinder 20 through means of pressure line 32.

Table 12 includes clamp means 34 which receives one end of a circuit carrier and, in combination with pins 36, maintains the circuit carrier in position during the bonding operation. The carrier is described below with reference to FIG. 3.

Mounted on front plate 38 are a plurality of dials 40 which indicate head temperature, line pressure, and electric power. Manually operated switches 42 and 44 are provided on panel 46 for initiating automatic cycling of the apparatus as will be described further below.

Figure 2:
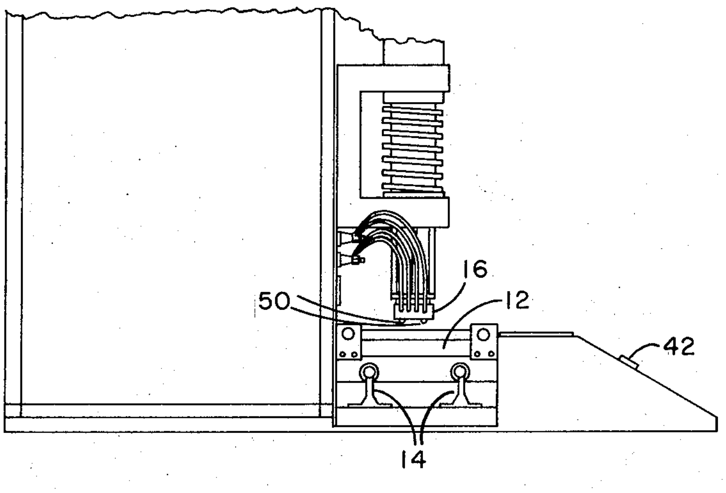
FIG. 2 is a side view of the bonding apparatus of FIG. 1.

FIG. 2 is a side view of a portion of the apparatus shown in FIG. 1 and further illustrates the bonding portion and table. It will be noted that the bonding surface of head 16 includes two parallel ridges 50 which effect the thermo-compression bonding of the lead frames to the microelectronic circuits. As described above, table 12 moves horizontally along rails 14.

Figure 3:
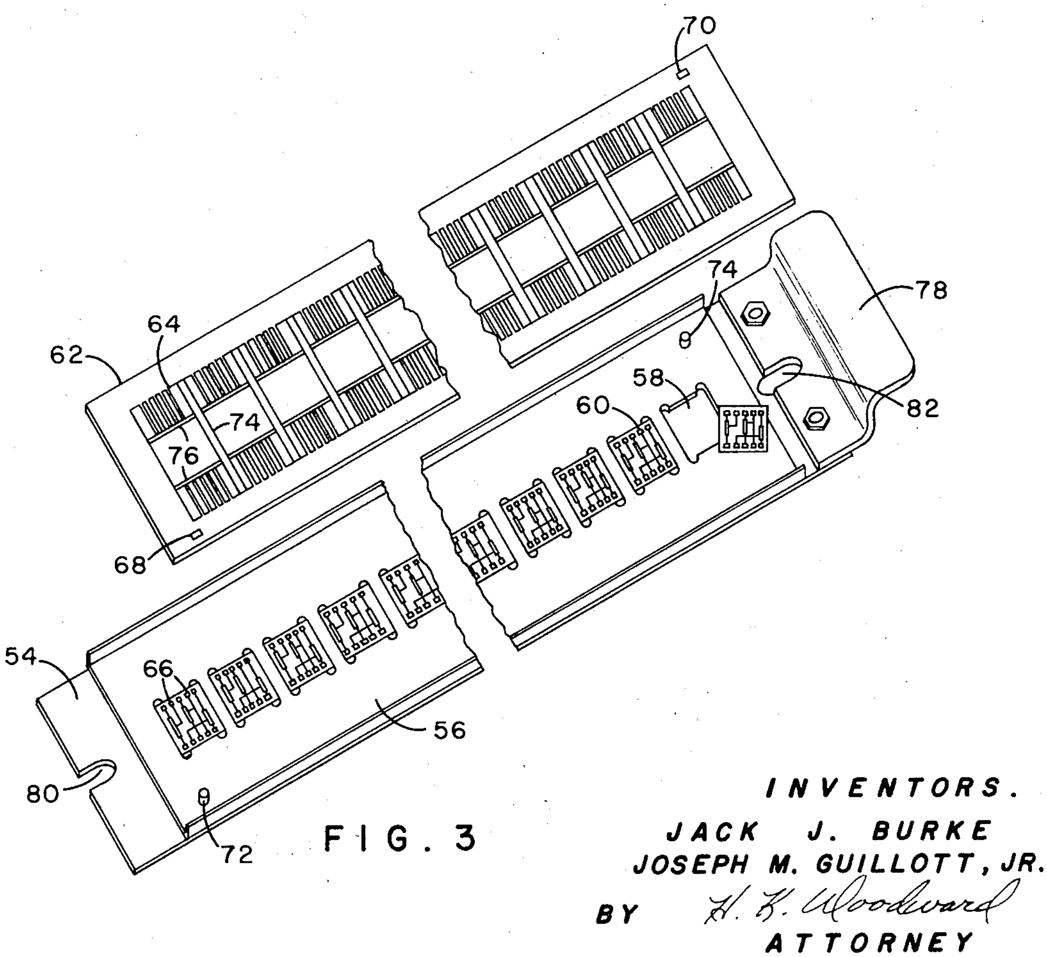
FIG. 3 is an exploded perspective view of a lead frame and circuit carrier as used in the present invention.

The carrier for the microelectronic and lead frames is illustrated in the exploded perspective view of FIG. 3. The carrier includes a support plate 54 on which is received the circuit accommodating member 56. Member 56 includes a plurality of cutout portions 58 of suitable dimensions for firmly accommodating the microelectronic circuits 60. Lead frame 62, shown removed from the carrier in this exploded view, includes a plurality of leads 64 which are designed for proper alignment with bonding pads 66 on the circuit substrates 60. The lead frame comprises a material which is compatible with thermo-compression bonding to the metal pads 66 of substrates 60. For example, in one embodiment, the lead frame comprises copper with a finish of gold plated over nickel, while the contacts 66 on the circuit substrate comprise successive evaporated layers of gold, gold-titanium, and tantalum. Frame 62 includes holes 68 and 70 at opposing corners which receive posts 72 and 74, respectively, of the carrier member 54 to insure proper alignment with the circuit substrate on the carrier 54. Frame 62 also includes members 74 which provide structural integrity of the leads prior to bonding, and members 76 which are attached to the ends of leads 64 and provide support and alignment for the leads prior to bonding of the leads to the substrate. After the leads are bonded to the pads 66 on the substrate, members 74 and 76 are removed from the leads by a manual fracturing thereof. At the joinder point of lead 64 and piece 74 the material is crimped to facilitate fracture.

Handle 78 is provided on carrier 54 to facilitate manual loading of the carrier on table 12. Posts 36 on table 12 are received by slots 80 and 82 on table 54, and the end portion of carrier 54 which is adjacent to slot 80 is firmly received underneath receiver 34 on table 12.

Figure 4:
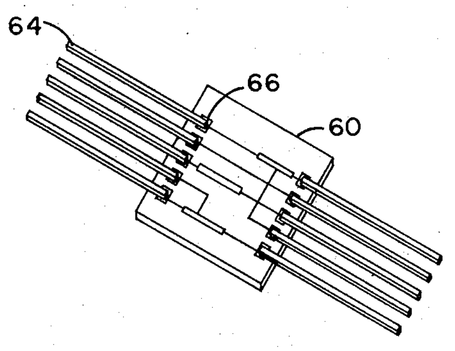
FIG. 4 is a perspective view of a microelectronic circuit including thermo-compression bonded leads.

FIG. 4 is a perspective view of a microelectronic circuit 60 after leads 64 have been attached to pads 66, members 74 and 76 have been removed by fracturing, and the peripheral portion of lead frame 62 has been removed by shearing. In accordance with the teachings of copending application, Ser. No. 777,050, supra, the microelectronic circuit is completed by attaching a cover directly to the substrate of the circuit.

Figure 5:
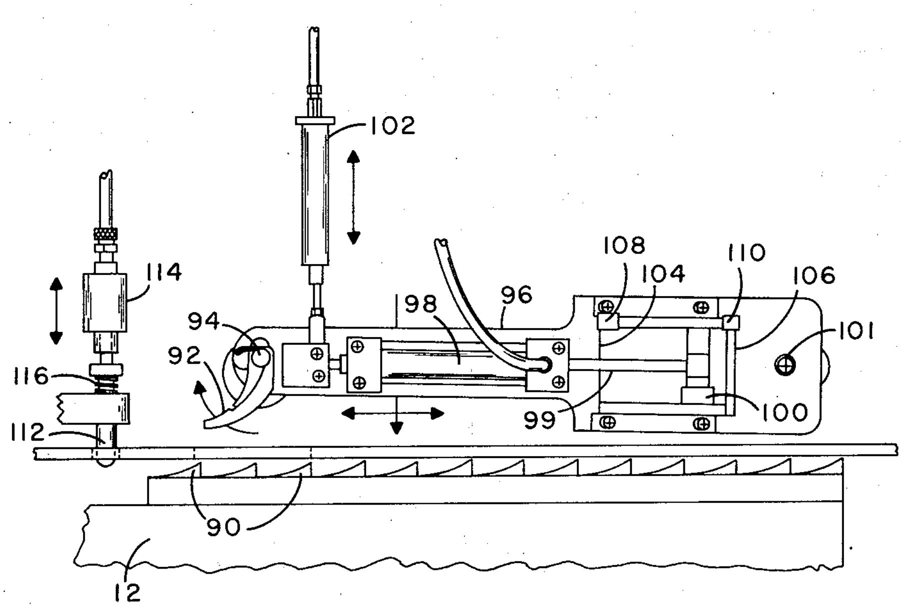
FIG. 5 is a top view illustrating the indexing means of the apparatus of FIG. 1.

FIG. 5 is a top view illustrating the indexing portion of the bonding apparatus shown in FIG. 1. The inner edge of table 12 is provided with a plurality of ratchet teeth 90 which are spaced the desired indexing distance. Pawl 92 is pivotally mounted at point 94 on support member 96 for engagement with the ratchet teeth 90. The pawl is driven by pneumatic cylinder 98 which is also mounted on support member 96. Support member 96 is pivotally mounted at point 101 whereby pawl 92 may rotatably move out of engaging contact with teeth 90 by means of a pneumatic cylinder 102. The travel of the piston of cylinder 98 is limited by member 100 on an extension of the piston rod engaging metal stops 104 and 106 which are part of support member 96. Microswitches 108 and 110 are provided at either stops 104 and 106 to indicate the positioning of stop 100 at these respective positions. Microswitches 108 and 110 function in the control portion of the bonding apparatus as will be described further below.

Pneumatic cylinder 102 is provided to pivotally move pawl 92 out of engagement with ratchet teeth 90 upon the retraction of table 12 along the rail assembly at the completion of a processing cycle.

A table lock member 112 is provided for engaging table 12 and maintaining the stability thereof during the bonding cycle. Pneumatic cylinder 114 is provided for driving lock 112 into engagement with the table, and spring member 116 yieldably maintains lock member 112 out of engagement with table 12.

In operation, at the beginning of a cycle table 12 will be positioned at the right end of rails 14, as viewed in FIG. 1, and a loaded circuit carrier will be positioned on the table. Automatic operation is commenced by the operator depressing buttons 42 and 44 on the front panel 46 of the apparatus. The dual switch operation is a safety feature designed to prevent possible accidents due to the bonding apparatus operation while the operator has a hand under the bond head, for example.

In one specific embodiment of the apparatus, the table is initially indexed with the bonding head inhibited until the first circuit to be bonded is positioned under the bonding head. Upon the table moving to a bonding position, the locking mechanism 112 is engaged to prevent movement of the table and the bonding head is lowered into engagement with the circuit substrate. Concurrently, the pawl readies for the next indexing step. Advantageously, full pressure is not applied to the bonding head until firm engagement with the circuit substrate is made. Thereupon, full pressure is momentarily applied to the bonding head for a limited period of time (e.g., 45 PSI for 2 seconds) and then the bonding head automatically retracts. Upon retraction of the bonding head, the locking mechanism 112 is also retracted, and pawl 92 indexes the table to position the next circuit beneath the bonding head.

Operation continues automatically until all circuits have been bonded. Thereupon, the table contacts a microswitch at the limit of travel which initiates return of the table to the initial position for unloading of the bonded circuits and reloading of another batch of circuits for processing. Operation automatically ceases upon return of the table, and switches 42 and 44 must again be concurrently closed to again initiate operation.

Figure 6:
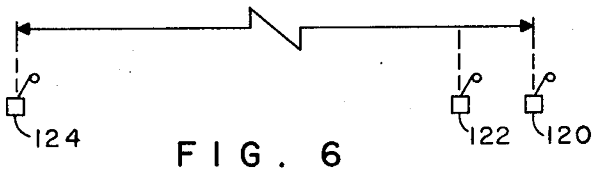
FIG. 6 illustrates the positioning of microswitches along the travel of the movable table of the bonding apparatus shown in FIG. 1.

Control of the automatic cycling of the bonding apparatus will now be described with reference to FIGS. 6–10. In this specific embodiment, air logic is utilized in combination with five pneumatic cylinders and five microswitches. FIG. 6 depicts the location of three of the microswitches along the travel of table 12. Switch 120 at the end of table travel is closed upon the table retracting at the completion of the cycle and deactuates the system. Reactuation of the system is effected through the concurrent depression of switches 42 and 44, described above. Switch 122 is closed during initial indexing of the table, prior to the first circuit being positioned under the bonding apparatus, and deactuates operation of the bonding mechanism. Once a circuit is positioned for bonding, microswitch 122 is released and the bonding mechanism is actuated. Microswitch 124 is located at the other end of the table travel and is closed upon the table indexing after all bonding operations have been completed. The closing of switch 124 actuates a solenoid which returns table 12 to the initial position. The functions of microswitches 120, 122, and 124 will be better understood from the following description.

Figure 7:
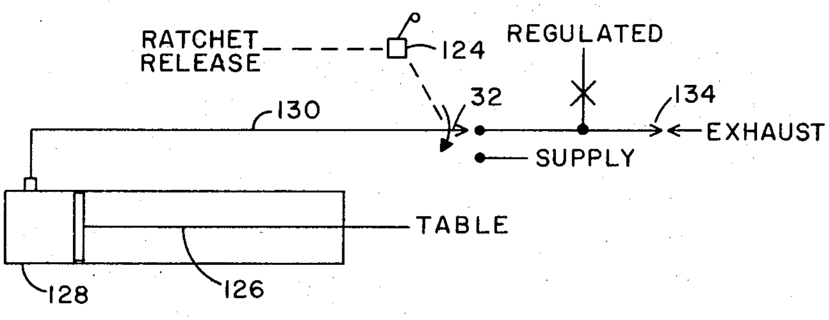
FIG. 7 illustrates the retracting means for the table.

Referring to FIG. 7, the operation of microswitch 124 is illustrated. As the bonding table indexes, piston 126 in pneumatic cylinder 128 moves to the left and creates a back pressure to the movement of the table. This back pressure facilitates smooth movement of the table, and the excess pressure bleeds off through gas line 130, switch 132, and needle valve 134. Upon the table indexing to the end of its travel, switch 124 is closed which effects the transfer of line 130 through gas valve 132 to a high supply pressure, and concurrently releasing the ratchet indexing means. The application of high supply pressure to cylinder 128 drives table 12 back to the initial position for unloading and loading of circuit substrates.

Figure 8:
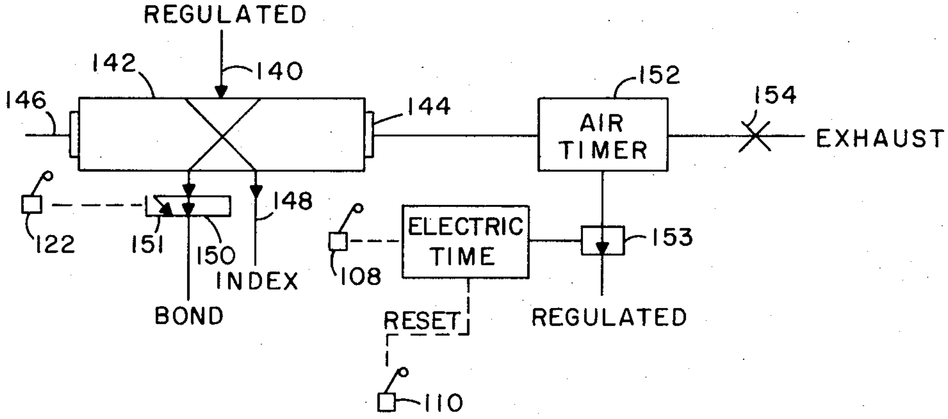
FIG. 8 is a schematic of timing and switching means used in the bonding and indexing cycles of the bonding apparatus.

Referring now to FIG. 8, the gas supply for the indexing and bonding cycles is illustrated. Regulated pressure is applied to the port 140 of two-way valve 142. When no pressure is present at port 144, the pilot pressure at port 146 directs the regulated supply pressure to the indexing line 148. However, upon the application of a gas pressure at port 144 which is greater than the pilot pressure, the regulated supply pressure is applied through valve 150 to the bond air line 151. Valve 150 is open until microswitch 122 is closed and thereupon valve 150 is also closed. Thus, with reference to the description of FIG. 6 above, during the first two indexing cycles of table 12 during which microswitch 122 is closed, the bonding apparatus is deactuated by means of valve 150 being open. An air timer 152 is provided in the input line to port 144 to limit the duration of the bonding cycle. Gas pressure is momentarily applied to timer 152, and this pressure bleeds off through needle valve 154 to an exhaust. The application of the regulated supply pressure to the air timer 152 is controlled by a microswitch in the indexing portion to be described below with reference to FIG. 9.

Figure 9:
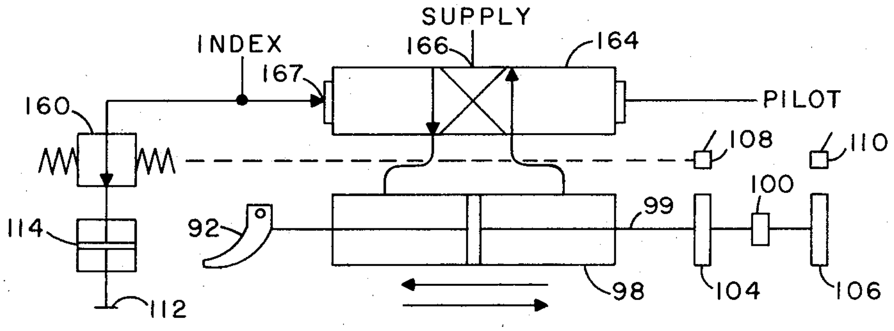
FIG. 9 is a schematic of the indexing means of the apparatus of FIG. 1.

FIG. 9 illustrates the control circuitry for the indexing means and should be taken with FIG. 5. Pawl 92 of the ratchet is driven by air cylinder 98. As the table is indexed to a new position limit member 100 on the piston shaft 99 engages limit member 104 and trips microswitch 108. The closing of microswitch 108 opens valve 116 thereby allowing pressure to cylinder 114 and applying locking mechanism 112 to the table. The closing of microswitch 108 also effects the momentary application of the regulated supply pressure through valve 151 to the air timer 152 shown in FIG. 8. Thereupon, the index pressure which is connected to the port 162 of valve 164 is removed and the pressure is applied to the bonding mechanism, as described above with reference to FIG. 8. Thereupon, the supply pressure at port 166 of the valve 164 is applied to the gas cylinder thereby retracting pawl 192 until stop member 100 engages limit member 106. Thereupon, microswitch 110 is closed and the electrical timer means which controls the application of the regulated supply pressure to the gas timer of FIG. 8 is reset. Until this electric timer is reset, further operation of the bonding mechanism is inhibited.

Figure 10:
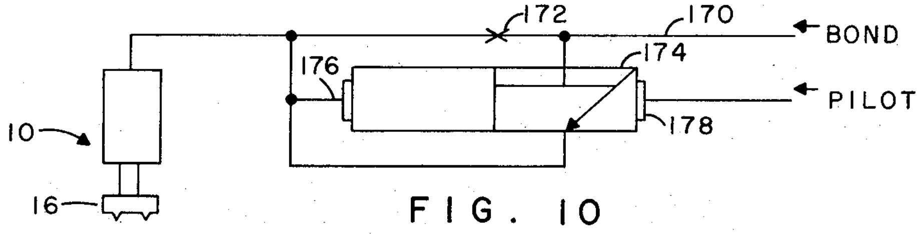
FIG. 10 is a schematic of the bonding means for the apparatus of FIG. 1.

The pneumatic control portion for the bonding mechanism is illustrated in FIG. 10. Advantageously, this control portion allows the bonding head to firmly seat on a circuit substrate before full pressure is applied thereto. The bond pressure from the switch illustrated in FIG. 8 is applied at line 170 and feeds through needle valve 172 and is applied to a closed switch valve 174. The pressure bleeding through needle valve 172 overcomes the spring pressure of the bonding mechanism shown generally at 10 thereby moving the bonding head 16 downwardly into engagement with a circuit substrate. Upon engaging the circuit substrate, pressure builds in the cylinder portion of the bonding mechanism thereby increasing the pressure on port 176 of valve 174. When the pressure at port 176 exceeds the pilot pressure applied at port 178, valve 174 opens and the full bonding pressure is applied through valve 174 directly to the bonding mechanism thereby effecting the thermo-compression bond of the lead frame to the substrate. The amount of delay built into the control upon the seating of bonding head 16 on a circuit substrate is controlled by the amount of pilot pressure applied at input 178. The higher the pilot pressure the longer the delay before pressure at input 176 overcomes the pilot pressure and opens valve 174. Conversely, the lower the pilot pressure the sooner valve 174 is opened and full pressure is applied to the bonding head. The provision of limited pressure through needle valve 172 until the bonding head firmly engages the substrate and then the application of full pressure has minimized the damage to substrates due to fracture.

Apparatus in accordance with the present invention has lowered the time and expense in attaching leads to microelectronic circuits. The automatic cycling allows the bonding of five circuits per minute whereas in the conventional wire bonding operation the attachment of leads to a single substrate required as much as ten minutes or longer. Further, the reject rate due to insufficient bonds or fractured substrates is minimal with the described system.

While the invention has been described with reference to a specific embodiment, the description is illustrative and is not to be construed as limiting the scope of the invention. Various modifications and changes may occur to those skilled in the art without departing from the spirit and scope of the invention as defined by the appended claims.

We claim:

1. Thermo-compression bonding apparatus for bonding lead frames to microelectronic circuits comprising:
   vertically movable bonding means including a bonding head and drive means, said drive means including a pneumatic cylinder and pneumatic supply means for applying limited pressure to said cylinder until said bonding head firmly engages a circuit substrate and then applying full bonding pressure to said pneumatic cylinder thereby effecting a thermo-compression bond,
   horizontally movable table means movable beneath said bonding means and including a table having ratchet teeth, said table accommodating a plurality of lead frames and circuits for bonding,
   support means for movably supporting said table means, and indexing means for sequentially indexing said table means in synchronization with said drive means and including pawl means for advancing said table, said pawl means including a pawl member for engaging said teeth, a pneumatic cylinder for advancing and retracting said pawl member, stop means for limiting the travel of said cylinder piston, and switch means for indicating the two extremities of travel of said piston, whereby said plurality of lead frame and circuits are sequentially indexed beneath said bonding means for bonding.

2. Thermo-compression bonding apparatus as defined by claim 1 wherein said supply means includes a source of bonding pressure, means including needle valve means for supplying said bonding pressure to said cylinder, and means including switchable valve means for supplying said bonding pressure to said cylinder when the pressure within said cylinder exceeds a selected minimum value.

3. Thermo-compression bonding apparatus as defined by claim 2 and further including pneumatic switch means for applying operating pressure alternately to said bonding means and to said indexing means.

4. Thermo-compression bonding apparatus as defined by claim 3 wherein said first switch means actuates table lock means when said table advances to its extreme forward position and actuates said pneumatic switch means for applying pressure to said bonding means momentarily, and wherein said pressure cannot be reapplied to said bonding means until after said piston moves to its extreme retract position and said second switch means is actuated thereby.

5. Thermo-compression bonding apparatus as defined by claim 4 and including table retract means for retracting said table to its initial operating position after completion of a processing cycle, said means including pneumatic cylinder means for moving said table and switch means for actuating said cylinder means and releasing said indexing means.

6. Thermo-compression bonding apparatus as defined by claim 1 and further including circuit carrier and alignment means comprising a support member including a planar portion, an alignment member including a planar portion with cutout portions in said planar portion of suitable dimensions for accommodating a circuit substrate, means for positioning said planar portion of said alignment member on said planar portion of said support member and for positioning a lead frame on said alignment member.

* * * * *